United States Patent [19]

Stephens, Jr. et al.

[11] Patent Number: 5,450,364
[45] Date of Patent: Sep. 12, 1995

[54] METHOD AND APPARATUS FOR PRODUCTION TESTING OF SELF-REFRESH OPERATIONS AND A PARTICULAR APPLICATION TO SYNCHRONOUS MEMORY DEVICES

[75] Inventors: Michael C. Stephens, Jr., Stafford; Vipul C. Patel, Sugar Land, both of Tex.

[73] Assignee: Texas Instruments Incorporated, Dallas, Tex.

[21] Appl. No.: 189,539

[22] Filed: Jan. 31, 1994

[51] Int. Cl.⁶ .............................................. G11C 7/00
[52] U.S. Cl. .................................. 365/222; 365/201; 365/230.03
[58] Field of Search ............ 365/222, 200, 201, 230.03

[56] References Cited

U.S. PATENT DOCUMENTS

| | | | |
|---|---|---|---|
| 4,783,768 | 11/1988 | Tanimura | 365/222 |
| 4,972,376 | 11/1990 | Torimaru et al. | 365/222 |
| 5,077,693 | 12/1991 | Hardee et al. | 365/230 |
| 5,083,296 | 1/1992 | Hara et al. | 365/230 |
| 5,146,430 | 9/1992 | Torimaru et al. | 365/222 |
| 5,172,341 | 12/1992 | Amin | 365/222 |
| 5,295,109 | 3/1994 | Nawaki | 365/222 |
| 5,299,168 | 3/1994 | Kang | 365/222 |
| 5,313,428 | 5/1994 | Inoue | 365/222 |
| 5,321,661 | 6/1994 | Iwakiri et al. | 365/222 |

OTHER PUBLICATIONS

Reese, Ed and Eddy Huang, *A Sub-10nS Cache SRAM for High Performance 32 Bit Microprocessors*, IEEE, 1990 Cust. IC confr., pp. 24.2.1–24.2.4.

Wilson, Ron, *Will the Search for the Ideal Memory Architecture Ever End?*, Computer Design, Jul. 1, 1990, pp. 78–99.

Hochstedler, Charles, *Self-Timed SRAMs Pace High-Speed ECL Processors*, Semiconductor Memories, 1990, pp. 4–10.

Lineback, J. Robert, *System Snags Shouldn't Slow the Boom in Fast Static RAMS*, Electronics, Jul. 23, 1987, pp. 60–62.

Triad Semiconductors Inc., *Static RAMs have on-chip address and Data Latches for Pipelining*, EDN, Dec. 8, 198, p. 116.

Cole, Bernard C., *Motorola's Radical SRAM Design Speeds Systems 40%*, Electronics, Jul. 23, 1987, pp. 66–68.

Iqbal, Mohammad Shakaib, *Internally timed RAMs Build Fast Writable Control Stores*, Electronic Design, Aug. 25, 1988, pp. 93–96.

Leibson, Steven, *SRAMs' On-Chip Address and data Ltches Boost Throughput in Pipelined Systems*, EDN, Oct. 13, 1988, pp. 102–103.

Gallant, John, *Special-feature SRAMs*, EDN, Jun. 20, 1991, pp. 104–112.

Weber, Samuel, *Specialty SRAMs Are Filling the Speed Gap*, Electronics, May 1990, pp. 85–87.

*Primary Examiner*—David C. Nelms
*Assistant Examiner*—Tan Nguyen
*Attorney, Agent, or Firm*—William W. Holloway; Richard L. Donaldson

[57] ABSTRACT

A method and apparatus for testing the self-refresh operation of a dynamic memory part are provided in which an oscillator (140) is coupled to a self-refresh counter (142). The self-refresh counter (142) causes a refresh row address counter (144) to generate row addresses for self-refresh cycles. The refresh row address counter (144) is coupled to a self-refresh control circuit (148). The self-refresh control circuit (148) is operable to generate a signal indicating completion of a self-refresh cycle. The refresh row address counter (144) is also coupled to a multiplexer (146). The multiplexer (146) outputs row addresses from either the refresh row address counter (144) or those supplied externally for rows to be refreshed.

13 Claims, 5 Drawing Sheets

METHOD AND APPARATUS FOR PRODUCTION TESTING OF SELF-REFRESH OPERATIONS AND A PARTICULAR APPLICATION TO SYNCHRONOUS MEMORY DEVICES

CROSS REFERENCES TO RELATED APPLICATIONS

This Application is related to the following copending Applications, all assigned to Texas Instruments Incorporated, and which are herein incorporated by reference: U.S. patent application Ser. No. 08/189,223, filed Jan. 31, 1994, entitled "A CLOCK CONTROL CIRCUIT ARRANGEMENT", Attorney Docket No. TI-18272; U.S. patent application Ser. No. 08/189,345, filed Jan. 31, 1994, entitled "METHOD AND APPARATUS FOR SYNCHRONOUS MEMORY ACCESS WITH SEPARATE MEMORY BANKS AND WITH MEMORY BANKS DIVIDED INTO COLUMN INDEPENDENT SECTIONS", Attorney Docket No. 18275; U.S. patent application Ser. No. 08/189,527, filed Jan. 31, 1994, entitled "METHOD AND APPARATUS FOR WRITING DATA IN A SYNCHRONOUS MEMORY HAVING COLUMN INDEPENDENT SECTIONS AND A METHOD AND APPARATUS FOR PERFORMING WRITE MASK OPERATIONS", Attorney Docket No. TI-18278; U.S. patent application Ser. No. 08/189,371, filed Jan. 31, 1994, entitled "METHOD AND APPARATUS FOR RECONFIGURING A SYNCHRONOUS MEMORY DEVICE AS AN ASYNCHRONOUS MEMORY DEVICE", Attorney Docket No. TI-18276; U.S. patent application Ser. No. 08/189,538, filed Jan. 31, 1994, entitled "METHOD AND APPARATUS FOR PREVENTING INVALID OPERATING MODES AND AN APPLICATION TO SYNCHRONOUS MEMORY DEVICES", Attorney Docket No. TI-18291.

TECHNICAL FIELD OF THE INVENTION

This invention relates generally to the field of electronic devices, and more particularly to a method and apparatus for production testing of self-refresh operations and a particular application to synchronous memory devices.

BACKGROUND OF THE INVENTION

The basic architecture of most data processing systems today includes a digital processor and random access memory. For economic reasons, the random access memory ("RAM") is often dynamic random access memory ("DRAM").

DRAMs typically include an array of memory cells, with each memory cell including a capacitor for storing charge representing data. Because of charge leakage from these capacitors, data will be lost if the capacitors are not periodically refreshed. The refresh period can be no longer than the time it takes for enough charge to leak from a capacitor to change the state that is read from the capacitor (the pause time).

Recently, synchronous dynamic random access memories ("SDRAM") have been proposed to better take advantage of inherent DRAM bandwidth. With synchronous DRAMs, data is clocked in and out of the memory device at relatively high rates. For example, some synchronous DRAMs may be capable of running at speeds of 100 Mhz or more. Under certain standardization agreements, synchronous DRAMs are required to include self-refresh operations. With self-refresh operations, refresh operations are performed under control of the device itself, rather than externally. Self-refresh functions are desirable for asynchronous DRAMs as well.

Self-refresh operations are desirable, for example, where power saving is important. For example, in laptop computers, external circuitry (circuitry outside of the memory device) is often deactivated at certain times to conserve energy. With the external circuitry deactivated, it is unable to generate refresh commands for refreshing DRAMs. Thus, the self-refresh operation is necessary.

A refresh operation for a memory array usually involves sequentially selecting each row of the memory array and refreshing all of the cells of a particular row at once.

To ensure the functionality of the self-refresh operation, the self-refresh operation is typically tested in the production environment. Because DRAMs are typically high-volume parts, testing of each chip is expensive and time consuming, and saving time in the testing of each chip results in significant time savings overall. Unfortunately, existing techniques for testing the self-refresh operation are inefficient.

One technique for testing the self-refresh operation is to write data into the memory array, and then enter the self-refresh mode. After a period of time longer than the pause time, data is read out of the memory array. If the data corresponds with that which was previously written into the array, then the self-refresh operation was performed properly. A second technique involves writing background data to the memory array, and then entering the self-refresh mode that also performs writing of opposite data to the memory array. After a period of time longer than the pause time of the memory cells, the data is read out. If any of the background data still persists, then the self-refresh operation was not performed properly, as not all data was changed.

Such techniques are time consuming, since writing-in and reading-out data to the whole array are time consuming operations. These problems exist for any DRAM part that includes the self-refresh operation, and in particular to synchronous DRAMs, wherein the self-refresh operation is required.

SUMMARY OF THE INVENTION

Therefore, a need has arisen for a method and apparatus for reducing the amount of time it takes to test the functionality of self-refresh operations.

In accordance with the teachings of the present invention, a method and apparatus for production testing of self-refresh operations and a particular application to synchronous memory devices are provided which substantially reduce or eliminate disadvantages and problems associated with prior systems.

In particular, circuitry for indicating completion of a self-refresh cycle of an array of dynamic memory cells arranged in rows is provided in which a refresh row address counter is operable to generate row addresses for rows to be self-refreshed. The refresh row address counter includes a plurality of bits, one of the bits being a most significant bit. A self-refresh counter is coupled to the refresh row address counter and operable to cause the refresh row address counter to generate an incremented row address after the self-refresh counter performs a predetermined number of counts. Self-refresh control circuitry is operable to generate an output signal based on the most significant bit after the refresh row address counter has generated row addresses for all rows to be self-refreshed.

Furthermore, a method of indicating completion of a self-refresh cycle of an array of dynamic memory cells arranged in rows is provided in which row addresses for rows to be self-refreshed are periodically generated, the row addresses including a most significant bit. An output signal is generated based on the most significant bit after generating row addresses for all rows to be self-refreshed.

A method of testing the self-refresh operation in a dynamic memory part is also provided in which a self-refresh test operation is initiated. Upon completion of a self-refresh cycle, a signal is generated. The amount of time elapsing between the initiation of the self-refresh test operation and generation of the signal is measured. It is then determined whether the amount of time measured is more or less than a pause time of the memory part.

An important technical advantage of the present invention is the fact that significant time savings are achieved in testing the self-refresh operation of dynamic random access memory parts. These time savings are achieved by generating an output signal upon completion of the self-refresh cycle, thus allowing a fast determination of whether the self-refresh cycle has been completed within the pause time of the memory part.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE INVENTION

Figure 1:
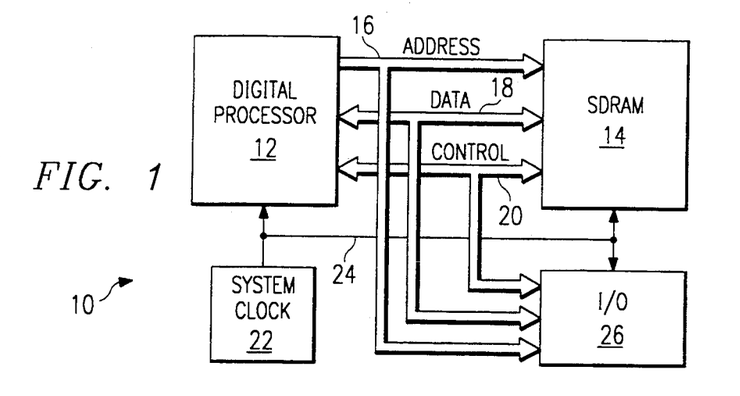
FIG. 1 illustrates a block diagram of a data processing system including a digital processor and synchronous DRAM.

FIG. 1 illustrates a block diagram of a data processing system 10. Data processing system 10 includes a digital processor 12 coupled to synchronous DRAM 14 through address bus 16, data bus 18, and control bus 20. System clock 22 is coupled to digital processor 12 and synchronous DRAM 14 through lead 24. Input/output ("I/O") device 26 is also coupled to digital processor 12 through buses 16, 18, and 20. I/O device 26 is also coupled to system clock 22 through lead 24. I/O device 26 may comprise, for example, a peripheral, such as a disk controller, or a device that allows communication with such a peripheral.

Data read from or written to synchronous DRAM 14 is transmitted across data bus 18. Reading and writing of data is controlled through control signals transmitted across control bus 20 and address locations transmitted across address bus 16. Typically, an address includes a row address and a column address. The address and control signals may be generated by digital processor 12 or by a memory controller. System clock 22 clocks the operation of digital processor 12 as well as synchronous DRAM 14. Address, data, and control signals, transmitted across buses 16, 18, and 20, respectively, are clocked into synchronous DRAM 14, and data is clocked out of synchronous DRAM 14. Therefore, the operation of synchronous DRAM 14 is synchronized with the system clock 22, and consequently with digital processor 12. It should be understood that the clock signal used to clock synchronous DRAM 14 may be derived from system clock 22. For example, digital processor 12 may output a clock signal that is derived from system clock 22 and which may be used to clock operation of synchronous DRAM 14.

The block diagram of FIG. 1 illustrates one possible configuration of a digital processor and a synchronous DRAM. With such a configuration, significant speed increases in memory access may be achieved over systems that use standard asynchronous DRAMs.

Figure 2:
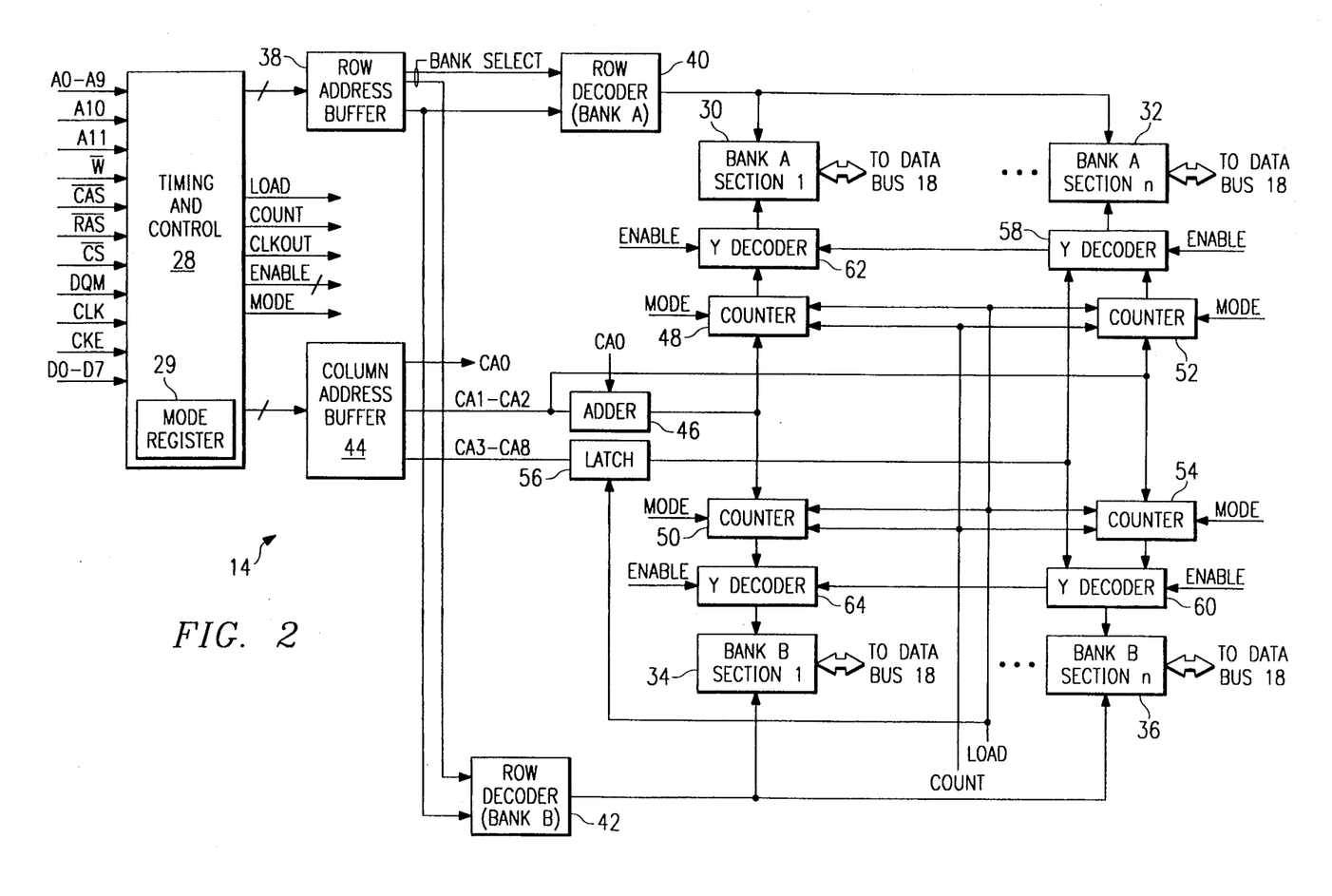
FIG. 2 illustrates a block diagram of a synchronous DRAM according to the teachings of the present invention.

FIG. 2 is a block diagram of synchronous DRAM 14 constructed according to the teachings of the present invention. Timing and control circuit 28 receives several inputs and generates several internal signals used to control and time the operation of synchronous DRAM 14. The inputs received by timing and control circuit 28 are listed in the following TABLE 1 and will be discussed in detail in connection with FIG. 2 and the remaining FIGUREs.

TABLE 1

| INPUT | DESCRIPTION |
| --- | --- |
| A0–A10 | Address Inputs |
| A11 | Bank Select |
| $\overline{W}$ | Write Enable |
| $\overline{CAS}$ | Column Address Strobe |
| $\overline{RAS}$ | Row Address Strobe |
| $\overline{CS}$ | Chip Select |
| DQM | Data/Output Enable |
| CLK | System Clock |
| CKE | Clock Enable |
| D0–D7 | Data Inputs/Outputs |

The input signal CLK is the system clock operating at a system frequency. The system frequency is the cycle rate of the CLK signal. It should be understood that the particular input signals listed in the table above are exemplary only, and other signals may be used without departing from the intended scope of the present invention. For example, 12 address inputs are shown, which allow for receiving time multiplexed row and column addresses. However, a different number of address lines may be used to allow row and column addresses to be received together. Also, more or less address lines may be used in connection with a memory device with more or less memory space, or with a differently arranged memory array. Similarly, although 8 data lines are shown, more or less data lines may be used without departing from the intended scope of the present invention.

The synchronous DRAM 14 may be advantageously operated in a burst mode. In the burst mode, data is written-in or read-out at bursts of specified lengths. Within each burst, data is accessed each clock cycle, thus providing for high-speed synchronous operation. In a particular embodiment, the length of each burst sequence may be 1, 2, 4, or 8 accesses, although longer bursts may also be used without departing from the present invention. Therefore, as an example, with a device that inputs or outputs 8 bits at a time (1 byte at a time), 1, 2, 4, or 8 bytes can be read or written in a burst. In such a burst, each byte follows the last byte with no clock delays in between.

During a burst operation, data may be read or written serially or interleaved. Serial and interleaved refer to the order in which logical address locations are accessed. The burst length and burst type (i.e., whether serial or interleaved) are user programmable and stored in a mode register 29 within timing and control circuit 28. In a particular embodiment, the burst length and burst type data may be received across the address lines after entering a programming mode.

The array of memory cells within synchronous DRAM 14 is divided into two banks, bank A and bank B, as shown in FIG. 2. Furthermore, each memory bank is divided into n memory sections. As shown in FIG. 2, bank A is divided into sections 30 through 32. Likewise, bank B is divided into sections 34 through 36. The present invention will be discussed in connection with an embodiment in which each memory bank is divided into two sections, it being understood, however, that each memory bank may be divided into many more sections.

Within bank A, the columns of section 30 are independent from the columns of section 32. Therefore, each section may be separately accessed. Thus, sections 30 and 32 are said to be "column independent." Similarly, sections 34 and 36 of bank B are column independent. In a particular embodiment, for example, each section contains 4,096 rows and 1,024 columns, with two rows in each section being addressed by one row address, and four columns in each section being addressed by one column address. Thus, in this particular example, 8 bits are accessed from each section for one row and one column address. In this embodiment, twelve address bits are used for the row addresses, with one of these twelve bits selecting the memory bank, and the other eleven bits selecting two rows in each section. Furthermore, nine address bits are used for the column addresses, with one of these nine bits selecting the memory section, and the other eight bits selecting four columns in a section.

By dividing memory banks into n column independent sections, synchronous DRAM 14 may be operated internally at 1/n of the external system frequency, thus providing a significant advantage, since higher speed internal operation is more complex and expensive. For example, by dividing bank A into sections 30 and 32, data can be read out of each section at one-half the external frequency, with data being output from synchronous DRAM 14 at the rate of the external system clock. This is accomplished by accessing one memory location from one section and simultaneously accessing the next location from the other section. Thus, for example, for an external system frequency of 100 Mhz, each section must only be operated at 50 Mhz when two sections are used.

For an access to synchronous DRAM 14, whether it be a read or a write, the row address is received on the address inputs A0-A11 and latched in row address buffer 38 upon activation of the $\overline{RAS}$ signal and the rising edge of the CLK signal in the correct mode. The outputs of row address buffer 38 are internal row addresses. As discussed above, the row and column addresses may be time multiplexed, and in a particular example, the row address is received first. A BANK SELECT signal, which may correspond to row address input A11, is used to select between memory banks, through activation of the row decoders 40 and 42. Row decoder 40 decodes row addresses for bank A and row decoder 42 decodes row addresses for bank B. The BANK SELECT signal is generated by timing and control circuit 28. In a particular embodiment, the BANK SELECT signal is generated in response to activation of the $\overline{RAS}$ input signal and row address input A11.

Row decoder 40 decodes row addresses for section 30 and section 32 of bank A, and thus enables rows in each memory section. Likewise, row decoder 42 decodes row addresses for sections 34 and 36 of bank B. In a particular embodiment, each section of a particular bank is logically identical, and the same rows of each section are decoded simultaneously. It should be understood that separate row decoders may be used for each section of a particular bank without departing from the intended scope of the present invention.

The following is a discussion of the circuitry that controls column operations for each column independent section of a particular memory bank. This column decoder circuitry is operable to synchronously enable columns in each of the memory sections substantially simultaneously. A column address buffer 44 latches the column address received on the address inputs upon activation of the $\overline{CAS}$ signal and the rising edge of the CLK signal in the correct mode. The outputs of column address buffer 44 are internal column addresses. The internal column address bits will be referred to as CA0–CAn. For the particular embodiment shown, in which each memory bank is divided into two sections, column address bit CA0 is used to select between sections 30 and 32 of bank A and sections 34 and 36 of bank B. In embodiments where more sections are used, then more of the column address inputs would be needed to select between sections. For example, in an embodiment with four sections, two column address bits, CA0 and CA1, would be used to select between each section.

The low order column address bits CA1 and CA2 are input to an adder 46. Adder 46 adds either 1 or 0 to these low order bits, depending on column address bit CA0. If CA0=1, then adder 46 adds 1. If CA0=0, then adder 46 adds 0. The output of adder 46 is coupled to the inputs of counters 48 and 50. Counter 48 is associated with section 30 of bank A, and counter 50 is associated with section 34 of bank B. The low order column address bits CA1 and CA2 are also coupled directly to counters 52 and 54. Counter 52 is associated with section 32 of bank A and counter 54 is associated with section 36 of bank B. In the particular embodiment being discussed, the low order column address bits that are input to counters 48, 50, 52, and 54 either directly or through adder 46, are column address bits CA1 and CA2. These two bits, along with column address bit CA0, allow for burst counts of up to 8. With the burst length sequences to be discussed in connection with Tables 2–4, no carry or overflow bits are needed from adder 46.

Counters 48–54 synchronously load initial column address data upon activation of a LOAD signal. The LOAD signal is output by timing and control circuit 28. Thereafter, counters 48–54 count in either serial or interleaved fashion, depending upon the status of the MODE signal input to each counter, which is based on the burst type status stored in mode register 29. Counting is synchronously controlled by the COUNT signal, which is based on the burst data stored in the mode register 29. When active, the COUNT signal operates at 1/n the external system frequency.

The higher order column address bits CA3–CA8 are input to latch 56 and latched upon activation of the LOAD signal. The output of latch 56 is coupled to column decoders 58 and 60. Column decoder 58 is associated with section 32 of bank A and column decoder 60 is associated with section 36 of bank B. Column decoder 58 is coupled to column decoder 62 associated with section 30 of bank A. Similarly, column decoder 60 is coupled to column decoder 64 associated with section 34 of bank B. Each column decoder 58–64 is coupled to an ENABLE signal.

Column decoder 58 is coupled to the output of counter 52. Similarly, column decoder 60 is coupled to the output of counter 54. Column decoder 62 is coupled to the output of counter 48. Similarly, column decoder 64 is coupled to the output of counter 50.

In operation of the particular embodiment being discussed, the BANK SELECT signal activates a particular bank. The following discussion is in connection with activation of bank A, it being understood that bank B operates similarly. Row decoder 40 decodes rows in both sections 30 and 32. Upon activation of $\overline{CAS}$ and the rising edge of the CLK signal, column address buffer 44 latches the column address. This column address is the starting address, and will be used to generate all the other column addresses needed to complete a burst operation. To achieve high speed operation, the present invention accesses the starting address from the memory section to which the starting address corresponds, and simultaneously accesses the next address of the burst from the other section. This process repeats until the burst is complete.

By performing simultaneous accesses to more than one section, delays associated with decoding column addresses are experienced in parallel, rather than serially, and thus the column access time for the simultaneous accesses are hidden. Such accesses are typically about 30 nanoseconds long. Furthermore, by having two memory banks, delays associated with precharging bit lines are avoided by accessing alternately between banks, since one bank can precharge while the other bank is being accessed.

The column address bits CA1 and CA2 are loaded into counter 52. Those two bits, incremented by 0 or 1 by adder 46, are loaded into counter 48. Column decoders 58 and 62 decode the appropriate columns in response to the addresses received through counters 48 and 52 and latch 56. To reduce redundant circuitry, column decoder 58 decodes the high order address bits received from latch 56 and generates decoded high order factors both for itself and for column decoder 62. These high order factors are transmitted from decoder 58 to decoder 62.

Thus, counter 52 loads initial address bits, and counter 48 loads the same bits incremented by 0 or 1 by adder 46. If the starting column address is in section 30 (i.e., CA0=0), the adder 46 will add 0, since the next location (i.e., CA0=1) is in section 32, and CA1 and CA2 are unchanged. If the starting column address is in section 32 (i.e., CA0=1), then adder 46 will add 1, since the next location (i.e., CA0=0) is in section 30, and CA1 and CA2 are incremented by one. These initial address bits are loaded into counters 52 and 48 upon activation of the LOAD signal, and then decoded by column decoders 58 and 62 along with the bits output by latch 56. Latch 56 latches bits CA3–CA8 upon activation of the LOAD signal. The first two addresses of a burst are accessed in this manner.

On the next internal clock cycle, the COUNT signal is activated and counters 48 and 52 count according to the status of the MODE signal, thus outputting incremented column addresses in synchronism with the internal clock frequency, allowing for access to the next two addresses of the burst. Depending on the MODE signal, counters 48 and 52 will count in either serial or interleaved fashion. Counting continues in synchronism with the internal clock frequency until the burst operation is completed. The ENABLE signal will enable each column decoder 58 and 62 during either a read or write operation. Once the burst operation is completed, the column decoders and row decoders will be disabled, allowing the memory sections to pre-charge for the next operation.

The logical memory space of sections 30 and 32 is arranged such that successive memory locations alternate between section 30 and 32. Pot serial access, memory locations are ordered according to this logical arrangement. For interleaved access, memory locations are still ordered alternately from section 30 to section 32 and back again, but according to an interleave routine. The following TABLES 2–4 illustrate the internal column addresses generated by the adder 46 and the counters 48 and 52 for burst lengths of 2, 4, and 8, to access memory locations. It should be understood that both memory sections 30 and 32 are accessed simultaneously, and thus the first and second locations are accessed at once, as are the third and fourth, fifth and sixth, and seventh and eighth locations.

TABLE 2

Sequences for Burst Length of 2

| | INTERNAL COLUMN ADDRESS CA0 | |
|---|---|---|
| | START | 2ND |
| Serial | 0 | 1 |
| | 1 | 0 |
| Interleave | 0 | 1 |
| | 1 | 0 |

TABLE 3

Sequences for Burst Length of 4

| | INTERNAL COLUMN ADDRESS CA1, CA0 | | | |
|---|---|---|---|---|
| | START | 2ND | 3RD | 4TH |
| Serial | 00 | 01 | 10 | 11 |
| | 01 | 10 | 11 | 00 |
| | 10 | 11 | 00 | 01 |
| | 11 | 00 | 01 | 10 |
| Interleave | 00 | 01 | 10 | 11 |
| | 01 | 00 | 11 | 10 |
| | 10 | 11 | 00 | 01 |

TABLE 3-continued

| Sequences for Burst Length of 4 | | | |
|---|---|---|---|
| INTERNAL COLUMN ADDRESS CA1, CA0 | | | |
| START | 2ND | 3RD | 4TH |
| 11 | 10 | 01 | 00 |

TABLE 4

| Sequences for Burst Length of 8 | | | | | | | | |
|---|---|---|---|---|---|---|---|---|
| INTERNAL COLUMN ADDRESS CA2, CA1, CA0 | | | | | | | | |
| | START | 2ND | 3RD | 4TH | 5TH | 6TH | 7TH | 8TH |
| Serial | 000 | 001 | 010 | 011 | 100 | 101 | 110 | 111 |
| | 001 | 010 | 011 | 100 | 101 | 110 | 111 | 000 |
| | 010 | 011 | 100 | 101 | 110 | 111 | 000 | 001 |
| | 011 | 100 | 101 | 110 | 111 | 000 | 001 | 010 |
| | 100 | 101 | 110 | 111 | 000 | 001 | 010 | 011 |
| | 101 | 110 | 111 | 000 | 001 | 010 | 011 | 100 |
| | 110 | 111 | 000 | 001 | 010 | 011 | 100 | 101 |
| | 111 | 000 | 001 | 010 | 011 | 100 | 101 | 110 |
| Inter- | 000 | 001 | 010 | 011 | 100 | 101 | 110 | 111 |
| leave | 001 | 000 | 011 | 010 | 101 | 100 | 111 | 110 |
| | 010 | 011 | 000 | 001 | 110 | 111 | 100 | 101 |
| | 011 | 010 | 001 | 000 | 111 | 110 | 101 | 100 |
| | 100 | 101 | 110 | 111 | 000 | 001 | 010 | 011 |
| | 101 | 100 | 111 | 110 | 001 | 000 | 011 | 010 |
| | 110 | 111 | 100 | 101 | 010 | 011 | 000 | 001 |
| | 111 | 110 | 101 | 100 | 011 | 010 | 001 | 000 |

As can be seen from these tables, data is ordered alternately between memory sections 30 and 32, regardless of burst type. The internal column address bits CA1 and CA2 shown in the tables are controlled by adder 46 and counters 48 and 52. The first two addresses accessed during any burst are determined by the start address and adder 46. All other addresses are determined by counters 48 and 52. The internal column address bit CA0 is used to determine which memory section contains the first accessed location of a burst operation. The counters 48–54 and adder 46 determine subsequent memory locations, and both sections are accessed simultaneously. Thus, CA0 is not changed until another burst operation is initiated. For clarity, the above TABLES 2–4 indicate CA0 changing, simply to illustrate the logical order of each accessed location.

In a particular embodiment, each column address accesses 8 bits, and 8 bits are output from each section each internal clock cycle. Thus, a total of 16 bits are output to the output buffers each internal clock cycle, which will be discussed.

The particular embodiment being discussed includes two sections for each memory bank. However, many more sections may be used as well. For an embodiment with n sections, n−1 adders would be included, with the nth memory section having no adder. The adders would add between 0 and 1 to the appropriate address bits, the results then being loaded into associated counters. Each of the n sections would have its own counter fed either directly from the appropriate column address lines or through an associated adder. The amount added by each adder would be determined by the starting address. For example, with the starting address in memory section x, with $1 < x < n$, then adders associated with memory sections x to n−1 would add zero, and adders associated with memory sections 1 to x−1 would add one. Zero is always added by the adder associated with the memory section containing the starting address. With n memory sections, n addresses of a burst would be accessed upon the initial load and then on each succeeding count. FIG. 2 illustrates n memory sections through use of the " . . . " symbol between sections.

Figure 3:
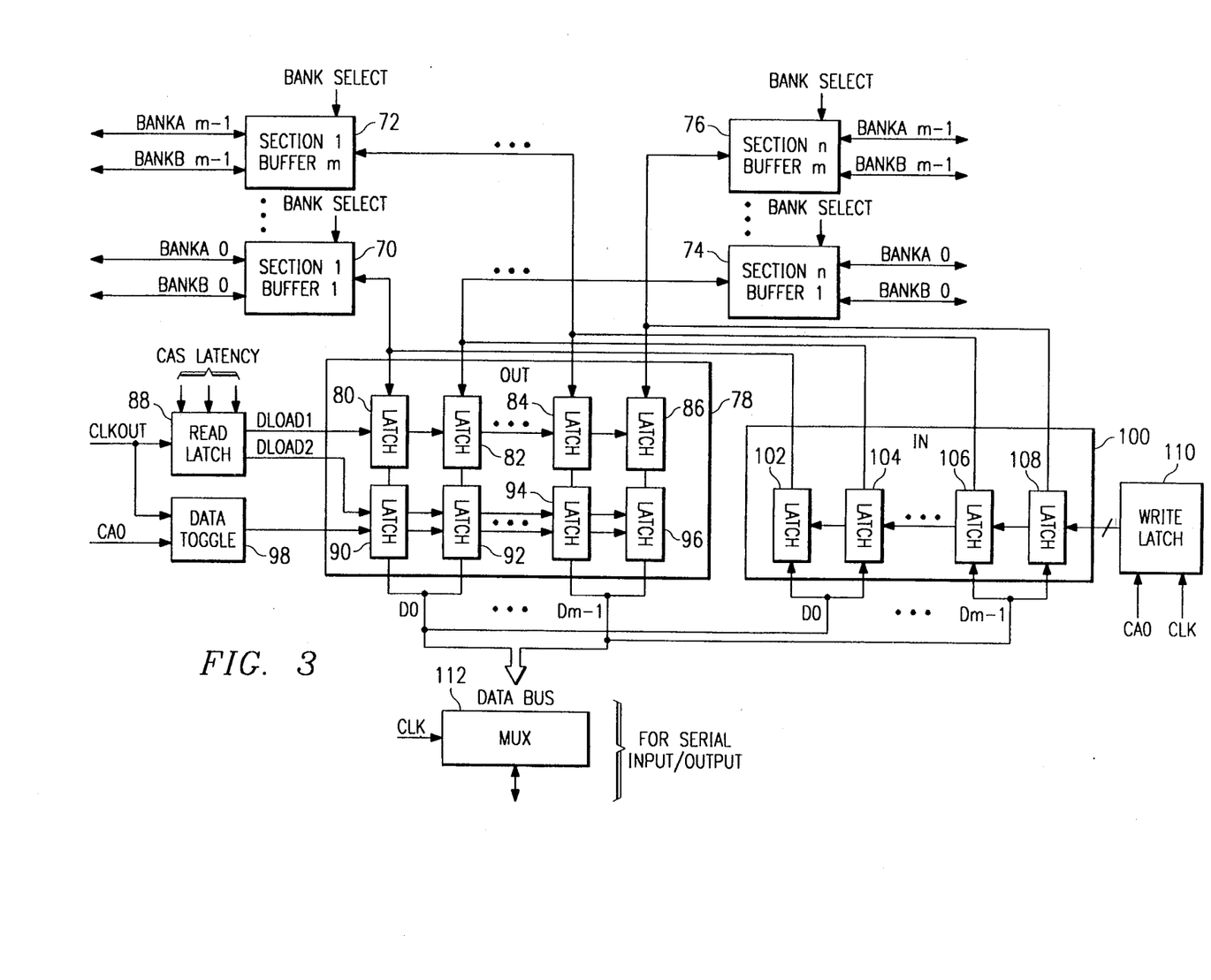
FIG. 3 illustrates I/O circuitry for a synchronous DRAM according to the teachings of the present invention.

FIG. 3 illustrates a block diagram of input/output circuitry for a synchronous DRAM constructed according to the teachings of the present invention. Each of the n sections into which the memory banks are divided include m buffers. Thus, buffers 70–72 are provided to receive output data and transmit input data to section 1 of banks A and B. Buffer 70 transmits internal data bit D0, while buffer 72 transmits data bit Dm−1, all for section 1. With respect to FIG. 2, buffers 70 and 72 would transmit data to and from sections 30 and 34 of banks A and B, respectively. Similarly, buffers 74 and 76 transmit data bits D0 and Dm−1 to section n of banks A and B. In the particular embodiment discussed in connection to FIG. 2, buffers 74 and 76 transmit and receive data to and from sections 32 and 36 of banks A and B. For the embodiment in which more than two sections per bank are used, one set of buffers would be provided for each section. Buffers 70–76 select between banks through the use of the BANK SELECT signal.

Data to be read from synchronous DRAM 14 is output through output buffer 78. The output buffer 78 is operable to substantially simultaneously receive data from the memory sections of a bank and to alternately output data from the memory sections in synchronism with the system frequency. Output buffer 78 is a two stage buffer, which allows data to be read out at the external clock frequency. Data from each of the buffers 70–76 is latched into the first latch stage of output buffer 78. This first latch stage includes one latch for each of the buffers 70–76. Thus, for m bits and memory banks divided into n sections, there are m times n latches in the first stage of the output buffer 78. In the particular example being discussed, in which there are 8 bits and two sections per memory bank, the first stage of output buffer 78 includes 16 latches, latches 80–86. In particular, latch 80 receives data from buffer 70, and latch 82 receives data from buffer 74. Latch 84 receives data from buffer 72, and latch 86 receives data from buffer 76.

Data to be read out is latched into latches 80–86 upon a DLOAD1 signal. DLOAD1 is generated by read latch control circuit 88. Read latch control circuit 88 clocks data out based on a CLKOUT signal generated by timing and control circuit 28. The frequency of the CLKOUT signal is equal to that of the external system clock frequency. The DLOAD1 signal, when active, operates at ½ the external system clock frequency, for an embodiment with two sections per memory bank. The DLOAD1 signal is also generated based on CAS latency data which is stored as a code in mode register 29. CAS latency is user programmable and determines the number of clock cycles that occur between assertion of the $\overline{CAS}$ signal and valid output data. Read latch circuit 88 also generates the DLOAD2 signal which latches data from the first latch stage of output buffer 78 into the second latch stage. The second latch stage of output buffer 78 includes latches 90–96. The second latch stage includes one latch per latch in the first stage.

A data toggle circuit 98 selects the order that the latches 90–96 will output data onto the output data lines. For the particular embodiment being discussed, in which each memory bank is divided into two sections, data toggle circuit 98 alternately selects between latches associated with each of the two sections. Thus, data toggle circuit 98 outputs its toggle signal based on the CLKOUT signal and a single input, bit CA0 of the column address. CA0 selects the order that the data from the two sections 30 and 32 of bank A and sections 34 and 36 of bank B will be output. Data toggle circuit 98 will cause the data in the second latch stage associated with each memory section to be alternately output. Once all the data has been output, the DLOAD2 signal will be asserted to load new data from the first latch stage. In the embodiment in which each memory bank is divided into more than two sections, then data toggle circuit 98 would receive sufficient input signals to select between each section for outputting data. Thus, the output buffer 78 receives data substantially simultaneously from each of the memory sections of a memory bank, and alternately outputs data from each of these memory sections in synchronism with the system frequency.

Data to be input to synchronous DRAM 14 is input through input buffer 100. Input buffer 100 includes latches 102-108. The number of latches in input buffer 100 is the same as the number of latches in either stage of output buffer 78. Write latch circuit 110 receives a clock signal at the system frequency and column address bit CA0 to choose which of the latches 102-108 receives the data being received on the data bus at a particular time.

A multiplexer 112 may also be included at the output stage to clock data in or out one bit at a time, in serial fashion, for appropriate applications, such as video applications.

Figure 4:
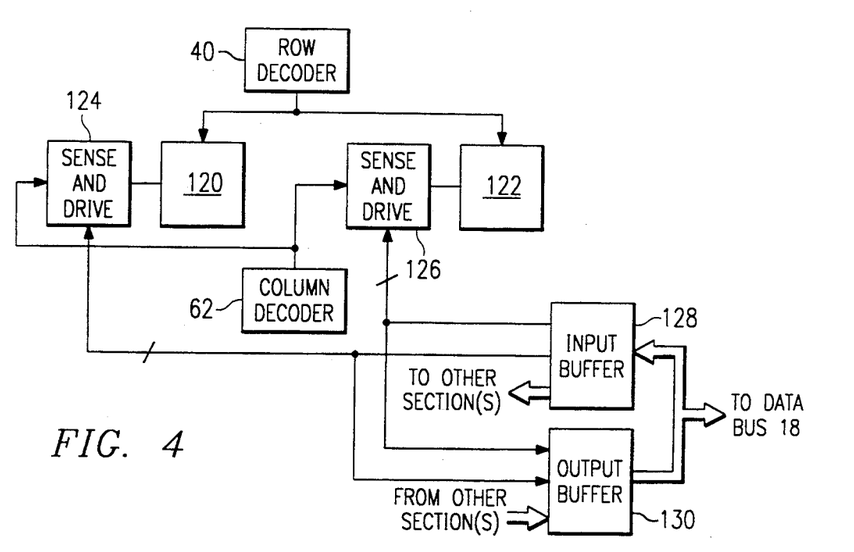
FIG. 4 illustrates a block diagram of a particular memory section of a synchronous DRAM according to the teachings of the present invention.

FIG. 4 illustrates a particular embodiment for one of the sections of one of the banks of memory of synchronous DRAM 14 illustrated in FIG. 2. The particular section discussed is section 30. As shown in FIG. 4, section 30 is divided into blocks 120 and 122. Each block includes one half of the rows of the total section 30, and may be considered repeating address spaces. Thus, in a particular example, each block includes 2048 rows. Row decoder 40 decodes the appropriate rows in each block 120 and 122. Column decoder 62 decodes the appropriate columns for each block and allows reading or writing through sense and drive circuits 124 and 126. Data output from or input to blocks 120 and 122 pass through input and output buffers 128 and 130. Input buffer 128 corresponds to buffers 70-76 and 100 of FIG. 3. Output buffer 130 corresponds to buffers 70-76 and 78 of FIG. 3. For an m bit device, m/2 bits are read from or written to block 120 and m/2 bits are read from or written to block 122.

In a particular embodiment, in which synchronous DRAM 14 inputs and outputs 8 bit of data at a time via data bus 18, row decoder 40 will decode one row each in blocks 120 and 122. Column decoder 62 will decode 4 columns in each block 120 and 122. Thus, 4 bits are accessed from each block 120 and 122, and a total of 8 bits are accessed at a particular section of a memory bank. It should be understood that the division of a particular section into two repeating blocks is exemplary only, and other arrangements for a particular memory section may be used without departing from the intended scope of the present invention. For example, a memory section need not be divided into separate blocks, or may be divided into more blocks than those shown in FIG. 4.

Figure 5:
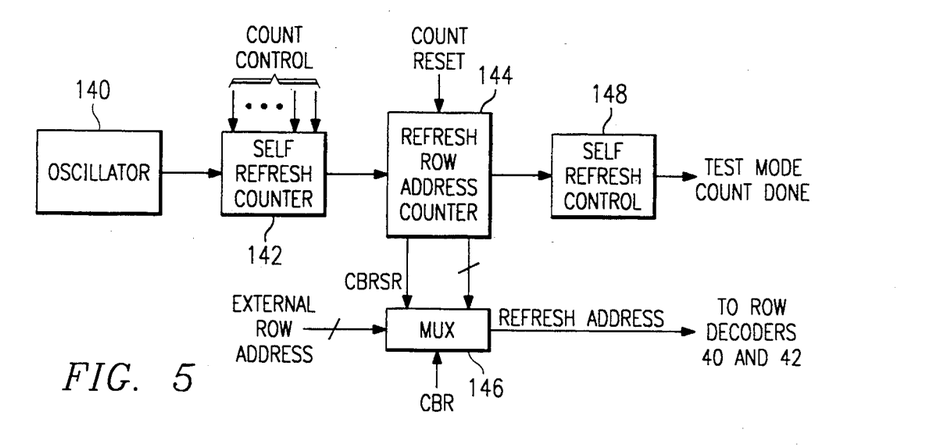
FIG. 5 illustrates a block diagram of a self-refresh control circuit according to the teachings of the present invention.

FIG. 5 illustrates a block diagram of a self-refresh operation circuit according to the teachings of the present invention. As shown in FIG. 5, an oscillator 140 is coupled to self-refresh counter 142. Self-refresh counter 142 is coupled to refresh row address counter 144. Refresh row address counter 144 generates addresses that are transmitted to multiplexer 146 during refresh operations. Multiplexer 146 selects, for transmission to row decoders 40 and 42, either row addresses received from the refresh row address counter 144 or received from the external system. Multiplexer 146 will select externally supplied addresses when a read or write command has been received, and multiplexer 146 will select addresses from refresh row address counter 144 when a refresh mode has been entered.

The refresh row address counter 144 generates addresses for both self-refresh operations and for externally controlled refresh operations.

In operation of the circuit shown in FIG. 5 during refresh operations, the address of each row to be refreshed is output by multiplexer 146 to the row decoders 40 and 42, since both memory banks are refreshed simultaneously. During refresh cycles executed under control of an external system, multiplexer 146 outputs row addresses supplied by the refresh row address counter 144 upon activation of the CBR signal, which corresponds to a refresh command received by the synchronous DRAM 14.

During a self-refresh operation, multiplexer 146 outputs row addresses received from refresh row address counter 144 upon activation of the CBRSR signal, which corresponds to the self-refresh mode. One self-refresh cycle follows immediately after another. Refresh row address counter 144 generates the row address for each row to be refreshed during a self-refresh operation. Refresh row address counter 144 increments the previously addressed row each time it receives a pulse from self-refresh counter 142. During a test mode, once all rows have been refreshed, refresh row address counter 144 outputs a signal to self-refresh control circuit 148, which, during the test mode, generates a COUNT DONE signal to indicate completion of the self-refresh cycle.

Self-refresh counter 142 counts at the rate of oscillator 140. When self-refresh counter 142 counts to a predetermined number, it outputs a pulse to increment refresh row address counter 144.

As the self-refresh operation is generally used for power savings, it is desirable that the amount of time it takes to perform one complete self-refresh cycle be no longer than necessary. Thus, a self-refresh cycle should take just enough time to ensure that all cells are refreshed before they lose data. Ideally, a self-refresh cycle would take no more or less time than that. Any more time would result in lost data, and any less time would result in unnecessary current flow, and thus more power consumption.

Because of process variations, the exact frequency of oscillator 140 varies from part to part. Therefore, to achieve the ideal self-refresh cycle period, the number of counts that self-refresh counter 142 performs before outputting its control pulse to refresh row address counter 144 will vary, depending on the rate of oscillator 140 and the pause time of the cells to be refreshed. To assist in achieving the goal of having just the right length refresh cycle time, metal options may be provided to adjust COUNT CONTROL inputs to self-refresh counter 142, such that it generates its control pulse to refresh row address counter 144 after the number of counts determined by these COUNT CONTROL inputs. Typically, a number of devices will be tested to determine whether the self-refresh counter 142 is appropriately adjusted. If it is not, then the metal options on subsequent batches of devices can be used to adjust self-refresh counter 142.

As can be seen from FIGS. 2 and 4, two rows in each section are accessed with one address by row decoders 40 and 42. During a self-refresh cycle, all sections of all banks are accessed by one address. Thus, in the particular embodiment with 4096 rows per section, a self-refresh cycle needs only 2048 row addresses, corresponding to 11 address bits, to refresh the entire array.

A significant advantage of the present invention is the fact that the COUNT DONE signal is generated by self-refresh control circuit 148 upon completion of the self-refresh cycle in the test mode. This COUNT DONE signal is coupled to a data output pin to indicate completion of the self-refresh operation in the test mode. By timing how long it takes from initiation of a self-refresh operation in the test mode to the output of the COUNT DONE signal, it can be quickly and easily determined whether the self-refresh operation has been performed within the pause time. If the COUNT DONE signal is received too quickly (i.e., much sooner than the pause time), then the particular part being tested can be sorted as a high-speed, high-power part. Furthermore, the self-refresh counter 142 can be adjusted, typically on subsequent batches of parts, to perform more counts before causing refresh row address counter 144 to count. Similarly, if the COUNT DONE signal is received too late (i.e., after the pause time), then the device under test can be sorted as a part without an operational self-refresh function. Furthermore, self-refresh counter 142 can be adjusted, typically on subsequent batches of parts, through use of the COUNT CONTROL signals to count fewer times before causing the self-refresh address counter 144 to count.

Figure 6:
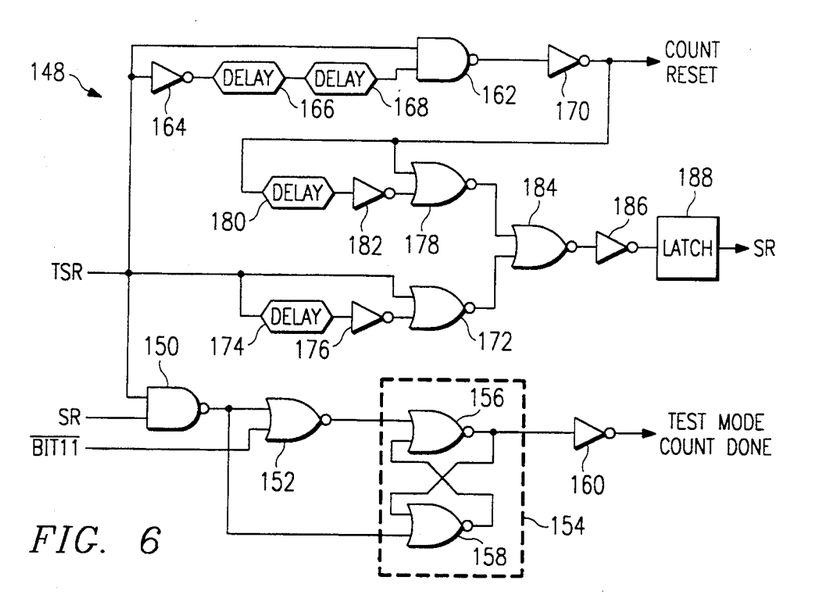
FIG. 6 illustrates circuitry for initiating and indicating completion of a self-refresh operation according to the teachings of the present invention.

FIG. 6 illustrates particular circuitry for self-refresh control circuit 148 used to generate the test mode COUNT DONE signal discussed in FIG. 5. As shown in FIG. 6, a TSR ("test self-refresh") signal is input to NAND-Gate 150. NAND-Gate 150 also receives an SR ("self-refresh") input. The output of NAND-Gate 150 is coupled to the input of NOR-Gate 152. NOR-Gate 152 also receives an input from the most significant bit of the refresh row address counter 144. This signal is $\overline{BIT11}$. The output of NAND-Gate 150 and the output of NOR-Gate 152 are coupled to the inputs of a flip-flop 154, comprised of NOR-Gates 156 and 158. The output of flip-flop 154 is coupled through inverter 160. The output of inverter 160 is the test mode COUNT DONE signal.

The TSR signal is also used to reset the refresh row address counter 144 and to generate the SR signal. This circuitry is also shown in FIG. 6. The TSR signal is coupled directly into one input of NAND-Gate 162 and to the other input of NAND-Gate 162 through inverter 164 and delay elements 166 and 168. In a particular embodiment, the delay inserted by each delay element 166 and 168 is 4 nanoseconds. The output of NAND-Gate 162 is coupled through an inverter 170 to form the COUNT RESET signal used to reset the refresh row address counter 144 to 0.

The TSR signal, in combination with the COUNT RESET signal, are used to generate the SR signal. As shown in FIG. 6, the TSR signal is coupled directly to one of the inputs of NOR-Gate 172, and to the other input of NOR-Gate 172 through delay element 174 and inverter 176. In a particular embodiment, the delay introduced by delay element 174 is 4 nanoseconds. The COUNT RESET signal is coupled directly to one of the inputs of NOR-Gate 178, and to the other input of NOR-Gate 178 through delay element 180 and inverter 182. In a particular embodiment, the delay introduced by delay element 180 is 4 nanoseconds. The outputs of NOR-Gates 172 and 178 are coupled to the inputs of NOR-Gate 184. The output of NOR-Gate 184 is coupled through inverter 186 to latch 188. Latch 188 outputs the SR signal.

In operation of the circuit shown in FIG. 6, the TSR signal is generated when the self-refresh command is entered while in the test mode. When TSR goes high, a high-going pulse of approximately 8 nanoseconds in duration is generated as the COUNT RESET signal. This pulse resets the refresh row address counter to 0. After approximately 8 nanoseconds, the pulse falls back to 0, due to the delay elements 166 and 168. The falling edge of the COUNT RESET signal initiates a high-going pulse at the output of inverter 186 which lasts approximately 4 nanoseconds. This high-going pulse is latched by latch 188, which outputs the SR signal.

With TSR and SR high, the test mode COUNT DONE signal will follow the most significant bit of the refresh row address counter 144. Once the $\overline{BIT11}$ signal is asserted (goes low), then the test mode COUNT DONE signal will go high, indicating that all rows have been counted. In the particular embodiment discussed in connection with FIG. 4, in which there are 4096 rows in each section, and two rows addressed in each section by the same row address, then 2048 row addresses are required to refresh the entire array. Thus, 11 bits are needed to count these addresses. With a 12-bit counter, the most significant bit will go high as soon as all 2048 addresses have been counted. The inverse of this most significant bit is the $\overline{BIT11}$ signal.

Upon completion of the self-refresh test, the TSR signal goes low, and thus the test mode COUNT DONE signal is de-asserted. The test mode COUNT DONE signal causes a designated output pin to go to a logic high level from tri-state.

Figure 7:
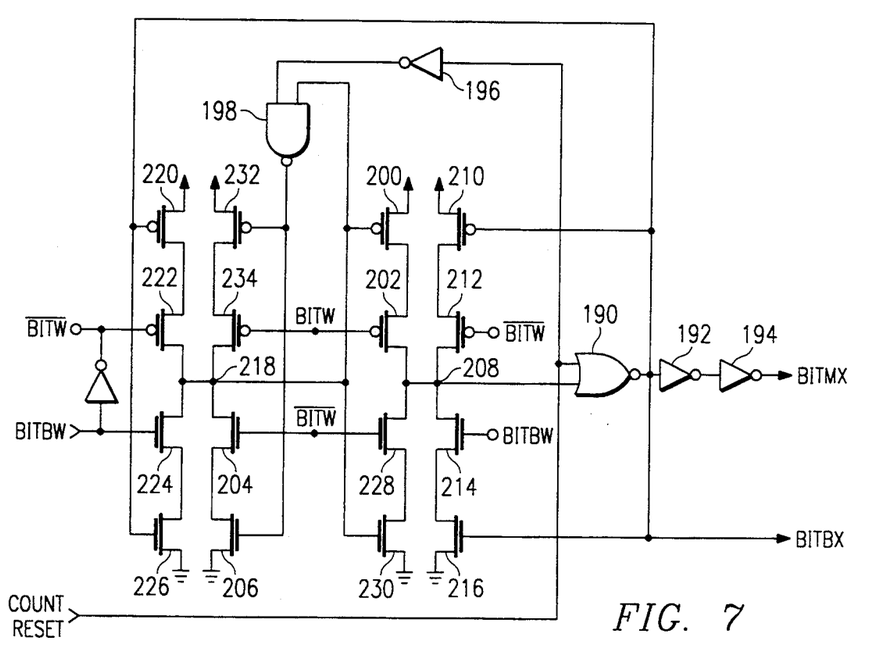
FIG. 7 illustrates circuitry included in a refresh row address counter according to the teachings of the present invention.

FIG. 7 illustrates one cell of the refresh row address counter 144. In the particular embodiment being discussed, in which refresh row address counter 144 is a 12-bit counter, the circuit shown in FIG. 7, which is circuitry for one cell (bit) of the counter, will be repeated 12 times.

As shown in FIG. 7, each of the cells of the refresh row address counter 144 receives a COUNT RESET input and a bitbW input. The bitbW input is received from the preceding cell. For the first cell (i.e., bit 0), the bitbW input is the count pulse received from self-refresh counter 142. Each cell outputs a bitmX and a bitbX output. The bitmX outputs are transmitted to the MUX 146 as row addresses. The bitbX outputs are coupled to the bitbW input of the succeeding cell of the refresh row address counter 144. The particular circuitry shown in FIG. 7 is exemplary only, and other counter circuits can be used without departing from the intended scope of the present invention.

The particular circuitry shown in FIG. 7 includes a NOR-Gate 190 coupled to inverters 192 and 194. Inverters 192 and 194 buffer the output of NOR-Gate 190. The output of NOR-Gate 190 is the bitbX output as well. The COUNT RESET signal is coupled to an input of NOR-Gate 190 and through inverter 196 to one of the inputs of NAND-Gate 198. Upon activation of the COUNT RESET signal, the output of NOR-Gate 190 goes low, and thus the bitmX and bitbX outputs go low as well. Thus, the COUNT RESET signal causes a resetting of all the bits of the refresh row address counter 144 to 0. Furthermore, the COUNT RESET pulse latches a high signal into the other input of NOR-Gate 190, such that after the COUNT RESET pulse, the outputs bitmX and bitbX temporarily remain low. This high signal is delivered through transistors 200 and 202. Similarly, the COUNT RESET signal latches a 0 to the other input of NAND-Gate 198, delivered through transistors 204 and 206.

The states of the bitmX and bitbX signals change only when the bitbW signal transitions from a high to a low. When the bitbW signal transitions from a low to a high, node 208 will be coupled to either a high signal through transistors 210 and 212 or to a low signal through transistors 214 and 216, depending on the previous state of the bitbX signal for that cell. If the previous bitbX signal was a 1, then node 208 will be low. If the previous bitbX output was a 0, then node 208 will be high. Similarly, node 218 will be coupled to a high signal through transistors 220 and 222 if the previous bitbX was low. Node 218 will be coupled to a low signal through transistors 224 and 226 if the previous bitbX signal was high.

On transitions of the bitbW signal from high to low, then the output signals bitmX and bitbX will change state. In particular, node 208 will be coupled to a high signal through transistors 200 and 202 if the previous bitbX signal was high. Likewise, node 208 will be coupled to a low signal through transistors 228 and 230 if the previous bitbX signal was low. Similarly, on transitions of bitbW from high to low, node 218 will be coupled to a high signal through transistors 232 and 234, if the previous bitbX signal was low, and node 218 will be coupled to a low signal through transistors 204 and 206 if the previous bitbX signal was high.

Thus, each cell of the counter will change states only when the preceding stage transitions from a high to a low. This transitioning accomplishes the count function. The bitmX signal for the 12th cell is used to generate the COUNT DONE signal of FIG. 6. The bitmX signal for the most significant bit will transition from a low to a high after all of the rows have been refreshed. In the particular example being discussed, the most significant bit is the 12th bit, and thus will transition from a low to a high after 2048 row addresses, corresponding to 4096 rows in each bank, have been counted. Thus, as shown in FIG. 6, the COUNT DONE signal will be generated upon activation of the $\overline{BIT11}$ signal (active low), which is the inverse of the bitmX signal for the most significant bit. (The 12th bit is referred to as bit 11, as the bits are counted from 0 to 11.)

Figure 8:
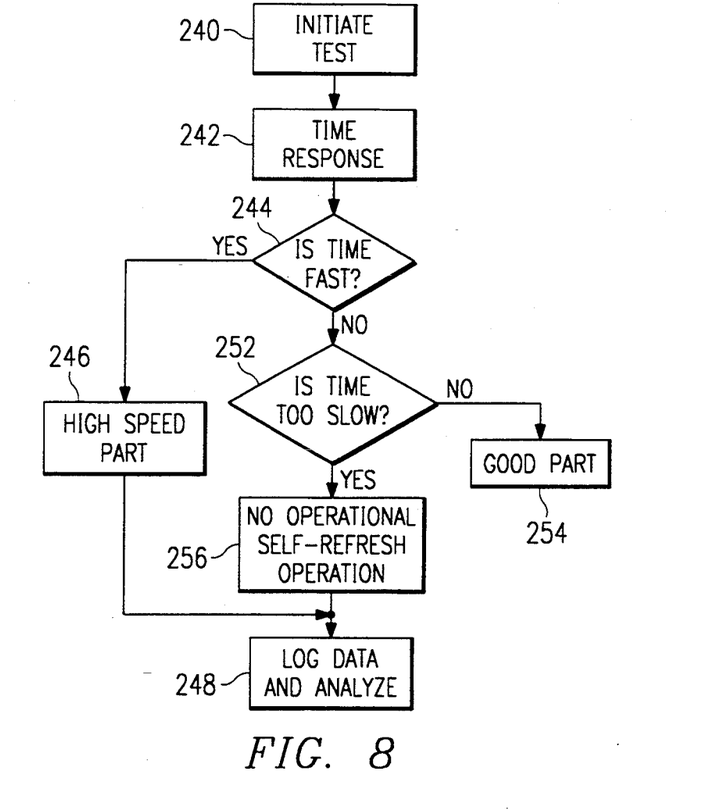
FIG. 8 is a flow diagram of a testing method according to the teachings of the present invention.

FIG. 8 illustrates a flow diagram for a test operation that uses the self-refresh test circuitry described above. As shown in FIG. 8, the test sequence is initiated at block 240. At block 240, a tester will cause the device under test to enter the self-refresh test mode. At block 242, the tester times the device under test to determine how quickly the COUNT DONE signal is received. At decision block 244, it is determined whether the COUNT DONE signal was received before the pause time of the memory cells has elapsed.

If the COUNT DONE is received more than a predetermined amount of time before the pause time elapses, then block 246 is encountered. At block 246, the part can be sorted as a high-speed part, that consumes more power during its self-refresh mode. Next, block 248 is encountered, where the time results are logged, and decisions can be made by a design group on whether to increase the count of self-refresh counter 142 on subsequent batches of devices, so as to increase the time it takes to complete a refresh cycle. Such increases can be made, for example, by exercising metal options discussed above.

If at decision block 244 it is determined that the self-refresh cycle was not completed a predetermined amount of time before the pause time of the memory cells has elapsed, then decision block 252 is encountered. If the self-refresh cycle has been completed within a predetermined amount of time before the pause time of the memory cells has elapsed, then block 254 is encountered, in which it is determined that the part has passed the test and is a good part.

If at decision block 252 it is determined that the COUNT DONE signal is received after the pause time of the memory cells has elapsed, then block 256 is encountered and the part is sorted as a part that does not have an operational self-refresh function. After block 256, block 258 is encountered wherein data on the time results are logged, and decisions can be made by a design group on whether to decrease the count of self-refresh counter 142 on subsequent batches of devices, so as to decrease the time it takes to complete a refresh cycle. Such decreases can be made, for example, by exercising metal options discussed above.

Although the present invention has been described in detail it should be understood that various changes, substitutions, and alterations can be made without departing from the spirit and scope of the invention as defined by the appended claims.

What is claimed is:

1. Circuitry for indicating completion of a self-refresh cycle of an array of dynamic memory cells arranged in rows, said circuitry comprising:

a refresh row address counter operable to generate row addresses for rows to be self-refreshed, said refresh row address counter generating a count in the form of a plurality of bits, one of said bits being a most significant bit;

a self-refresh counter coupled to said refresh row address counter and operable to cause said refresh row address counter to generate an incremented row address after said self-refresh counter performs a predetermined number of counts; and     self-refresh control circuitry operable to generate an output signal determined only by said most significant bit after said refresh row address counter has generated row addresses for all rows to be self-refreshed.

2. The circuitry of claim 1, and further comprising a reset circuit for generating a reset signal, said reset signal causing said plurality of bits to be reset to zero upon initiation of a self-refresh cycle.

3. The circuitry of claim 1, wherein the array of memory cells is divided into a plurality of independent memory sections, each of said memory sections further divided into two memory blocks, such that one row address generated by said refresh row address counter addresses two rows in each memory section.

4. The circuitry of claim 1, wherein said most significant bit is not used to address rows to be self-refreshed.

5. A method of indicating completion of a self-refresh cycle of an array of dynamic memory cells arranged in rows, said method comprising the steps of:

periodically generating row addresses for rows to be self-refreshed, the row addresses including a most significant bit; and generating a self-refresh cycle completion signal determined only by the most significant bit after generating row addresses for all rows to be self-refreshed.

6. The method of claim 5, and further comprising the step of resetting the first row address to zero upon initiation of a self-refresh cycle.

7. The method of claim 5, wherein the array of memory cells is divided into a plurality of independent memory sections, and further comprising the step of addressing two rows in each of said memory sections for each row address.

8. The method of claim 5, wherein the most significant bit is not used to address rows to be self-refreshed.

9. A method of testing the self-refresh operation in a dynamic memory part, said method comprising the steps of:

initiating a self-refresh test operation;

generating a signal upon completion of a self-refresh cycle;

measuring the amount of time elapsing between said steps of initiating and generating; and determining if the amount of time measured in said step of measuring is more or less than a pause time of the memory part.

10. The method of claim 9, and further comprising the step of sorting the part as not having a functional self-refresh operation, if the amount of time measured in said step of measuring is more than the pause time of the memory part.

11. The method of claim 9, and further comprising the step of decreasing, in subsequent batches of parts, the amount of time for completing a self-refresh cycle, if the amount of time measured in said step of measuring is more than the pause time of the memory part.

12. The method of claim 9, and further comprising the step of sorting the part as a high speed part, if the amount of time measured in said step of measuring is less than a predetermined amount of time less than the pause time of the memory part.

13. The method of claim 9, and further comprising the step of increasing, in subsequent batches of parts, the amount of time for completing a self-refresh cycle, if the amount of time measured in said step of measuring is less than a predetermined amount of time less than the pause time of the memory part.

* * * * *